United States Patent
Ponath et al.

(10) Patent No.: US 9,958,350 B2
(45) Date of Patent: May 1, 2018

(54) CAPACITIVE, CERAMIC PRESSURE-MEASURING CELL AND METHOD FOR THE PRODUCTION THEREOF

(71) Applicant: Endress + Hauser GmbH + Co. KG, Maulburg (DE)

(72) Inventors: Nils Ponath, Lorrach (DE); Andreas Rossberg, Bad Sackingen (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 171 days.

(21) Appl. No.: 14/896,470

(22) PCT Filed: May 19, 2014

(86) PCT No.: PCT/EP2014/060186
§ 371 (c)(1),
(2) Date: Dec. 7, 2015

(87) PCT Pub. No.: WO2014/198490
PCT Pub. Date: Dec. 18, 2014

(65) Prior Publication Data
US 2016/0131546 A1   May 12, 2016

(30) Foreign Application Priority Data

Jun. 11, 2013  (DE) .................. 10 2013 106 045

(51) Int. Cl.
*G01L 9/12* (2006.01)
*G01L 9/00* (2006.01)
(Continued)

(52) U.S. Cl.
CPC .......... *G01L 9/0072* (2013.01); *B23K 1/0016* (2013.01); *B23K 1/19* (2013.01);
(Continued)

(58) Field of Classification Search
CPC ... G01L 9/0005; G01L 9/0072; G01L 9/0075; B23K 1/0016; B23K 1/19;
(Continued)

(56) References Cited

U.S. PATENT DOCUMENTS 4,618,404 A * 10/1986 Pellegri ............... C25B 11/0478
204/290.14
5,001,595 A * 3/1991 Dittrich ................ G01L 9/0075
29/25.42
(Continued)

FOREIGN PATENT DOCUMENTS

CN   102455234 A   5/2012
CN   103189333 A   7/2013
(Continued)

OTHER PUBLICATIONS

English Translation of International Preliminary Report on Patentability, WIPO, Geneva, dated Dec. 23, 2015.
(Continued)

*Primary Examiner* — Benjamin Schmitt
(74) *Attorney, Agent, or Firm* — Bacon & Thomas, PLLC

(57) ABSTRACT

A pressure-measuring cell having a ceramic measuring membrane and a ceramic counter body, wherein the measuring membrane is joined to the counter body in such a way that a pressure chamber is formed between the measuring membrane and the counter body. The pressure-measuring cell also has a capacitive transducer for detecting a pressure-dependent deformation of the measuring membrane, which capacitive transducer has at least one membrane electrode arranged on the measuring membrane and at least one electrode on the counter body side, wherein according to the invention at least one membrane electrode comprises a titanium oxide.

11 Claims, 2 Drawing Sheets

(51) Int. Cl.
*B23K 1/00* (2006.01)
*B23K 1/19* (2006.01)
*C23C 8/16* (2006.01)
*C23C 14/00* (2006.01)
*C23C 14/14* (2006.01)
*C23C 14/34* (2006.01)
*B23K 103/00* (2006.01)

(52) U.S. Cl.
CPC ............ *C23C 8/16* (2013.01); *C23C 14/0036* (2013.01); *C23C 14/14* (2013.01); *C23C 14/34* (2013.01); *G01L 9/0075* (2013.01); *B23K 2203/52* (2015.10)

(58) Field of Classification Search
CPC ... B23K 2203/52; C23C 8/16; C23C 14/0036; C23C 14/14; C23C 14/34
USPC ............................ 73/715, 717, 718, 723, 724
See application file for complete search history.

(56) References Cited

U.S. PATENT DOCUMENTS

| | | | |
|---|---|---|---|
| 5,057,244 A | 10/1991 | Nitta et al. | |
| 6,267,009 B1 * | 7/2001 | Drewes | G01L 9/0044 361/283.4 |
| 7,743,664 B2 | 6/2010 | Sung | |
| 9,136,662 B2 | 9/2015 | Rossberg | |
| 2007/0218646 A1 * | 9/2007 | Hitosugi | C03C 17/2456 438/449 |
| 2010/0199778 A1 * | 8/2010 | Hegner | G01L 9/0075 73/724 |
| 2011/0041618 A1 | 2/2011 | Hegner | |
| 2016/0097691 A1 | 4/2016 | Ponath | |

FOREIGN PATENT DOCUMENTS

| | | |
|---|---|---|
| CN | 105264351 A | 1/2016 |
| DE | 3438437 A1 | 5/1985 |
| DE | 10114665 A1 | 9/2002 |
| DE | 102008036381 A1 | 4/2010 |
| DE | 102010043119 A1 | 5/2012 |
| JP | 2002214059 A | 7/2002 |
| TW | 200935040 A | 8/2009 |

OTHER PUBLICATIONS

International Search Report EPO, The Netherlands, Jul. 30, 2014.
German Search Report, German PTO, Munich, Jun. 24, 2013.

* cited by examiner

CAPACITIVE, CERAMIC PRESSURE-MEASURING CELL AND METHOD FOR THE PRODUCTION THEREOF

TECHNICAL FIELD

The present invention relates to a capacitive, ceramic pressure-measuring cell and a method for the production thereof.

BACKGROUND DISCUSSION

Generic pressure-measuring cells have a ceramic measuring membrane and a ceramic counter body, said measuring membrane is connected pressure-tight with the counter body along a circumferential joint, especially having an active brazing solder, wherein a pressure chamber is formed between the measuring membrane and the counter body, wherein the equilibrium position of the measuring membrane arises from the difference between a pressure prevailing in the pressure chamber and a pressure acting on the outer side of the measuring membrane facing away from the pressure chamber. Generic pressure-measuring cells also comprise a capacitive transducer for converting the pressure-dependent deformation of the measuring membrane into an electrical signal.

In particular, aluminum oxide ceramics, which are suitable for the production of pressure-measuring cells due to their elastic properties and their resistance to media, are used as the material for the counter body and the measuring membrane. The ceramic components mentioned are joined, in particular using an active brazing solder that preferably contains Zr—Ni—Ti. The production of such active brazing solder is disclosed, for example, in the European published patent application EP 0 490 807 A2. According to the method described in the publication, rings that must be positioned between the measuring membrane and the counter body to solder them together can especially be produced from the active brazing solder material.

For example, niobium, tantalum or silicon carbide are known as electrode materials for electrodes of the capacitive transducer, wherein the surface of the electrodes is to be optionally protected by a glass layer, as described in the publication EP 0 544 934 A1. Similarly, electrodes are known which comprise metallic particles in a glass matrix and are described, for example in the published German patent application DE 10 2007 026 243 A1.

The electrode materials mentioned are suitable for joining aluminum oxide ceramics using an active brazing solder in a high-temperature vacuum soldering process.

However, the temperature range in which an active brazing solder forms a high-quality pressure-tight connection with a ceramic material is comparatively narrow. At too low temperatures, the solder is not sufficiently reactive on the one hand and it is too viscous to spread evenly on a surface area to be wetted on the other.

However, at too high temperatures, there is a risk that the solder has such a low viscosity that it enters areas that are not meant to be wetted by it.

However, in the production of larger batches of measuring cells, it is inevitable that a temperature distribution that exploits the available temperature range is given in an oven. Nevertheless, provision of a solder stop that limits the spread of the active solder is known to obtain useful results.

A practiced method for limiting the radially inwardly flowing active brazing solder is oxidation of the surface of a membrane electrode, which comprises tantalum, and should be in galvanic contact with the active brazing solder. At relatively low soldering temperatures, entry of the active brazing solder into the pressure chamber can be prevented with an acceptable yield. However, if the soldering temperature is increased, the solder stop no longer acts reliably, and the solder flows over the edge of the tantalum electrodes into the pressure chamber. Apart from the narrow temperature range in which the pressure-measuring cells described are to be soldered, there is a further disadvantage that the electrodes now have at least two layers with different thermal coefficients of expansion, namely a metallic tantalum layer and a tantalum oxide layer. This may result in temperature-dependent mechanical stresses on the surface of the measuring membrane which cause a temperature hysteresis.

SUMMARY OF THE INVENTION

Therefore, the present invention has the object of providing a pressure-measuring cell which overcomes the above problems.

The object is achieved according to the invention by a pressure-measuring cell, comprising: a ceramic measuring membrane; a ceramic counter body; and a capacitive transducer, wherein: said measuring membrane is joined in a pressure-tight manner with said counter body to form a pressure chamber between said measuring membrane and said counter body; said capacitive transducer detects a pressure-dependent deformation of said measuring membrane, and comprises at least one membrane electrode that is arranged on said measuring membrane and at least one electrode on said counter body side; and said at least one membrane electrode comprises a titanium oxide, and a method of producing a pressure-measuring cell, a method of manufacturing a capacitive pressure-measuring cell, comprising a ceramic measuring membrane; a ceramic counter body; and a capacitive transducer, wherein: said measuring membrane is joined in a pressure-tight manner with said counter body to form a pressure chamber between said membrane and said counter body; said capacitive transducer detects a pressure-dependent deformation of said measuring membrane, and comprises at least one membrane electrode that is arranged on said measuring membrane and at least one electrode on said counter body side, and said at least one membrane electrode comprises a titanium oxide, the method comprises the following steps: providing a ceramic measuring membrane and a counter body; preparing at least one membrane-side electrode on the measuring membrane, and at least one electrode on the counter body side on a surface thereof; and pressure-tight joining of the measuring membrane to the counter body, forming a pressure chamber between the measuring membrane and the counter body, wherein: at least the membrane electrode comprised titanium oxide.

Recent work on an improved solder stop leads to an approach to this. To this end, the still unpublished German patent application DE 10 2013 105 132.4 discloses a pressure-measuring cell, which has a ceramic measuring membrane and a ceramic counter body, wherein the measuring membrane is joined pressure-tight with the counter body, forming a pressure chamber between the measuring membrane and the counter body by means of an active brazing solder, wherein on a surface of the measuring membrane and/or the counter body, the pressure-measuring cell also has a solder stop layer, which prevents the active brazing solder from inwardly radially entering the pressure chamber via the solder stop layer when the measuring membrane is joined with the counter body, wherein the solder stop layer comprises, for example, titanium oxide.

This solder stop layer has proven to be very effective, opening up a wider temperature range for joining the pressure-measuring cell.

Based on this finding, the present invention is now following the strategy of preparing the solder stop and at least the membrane electrode with the same material system, namely titanium oxide, which may be doped, for example, with Cr, Nb, W.

The pressure-measuring cell according to the invention comprises a ceramic measuring membrane and a ceramic counter body, wherein the measuring membrane is joined in a pressure-tight manner to the counter body, forming a pressure chamber between the measuring membrane and the counter body, wherein the pressure-measuring cell further comprises a capacitive transducer for detecting pressure-dependent deformation of the measuring membrane, which comprises at least one membrane electrode that is arranged on the measuring membrane and at least one electrode on the counter body side, wherein the membrane electrode(s) comprise(s) titanium oxide according to the invention.

The titanium oxide is arranged without intermediate layers on the ceramic material of the measuring membrane in accordance with a preferred embodiment of the invention.

This eliminates any sources of disturbing mechanical stresses due to different thermal coefficients of expansion. If titanium oxide has a thermal coefficient of expansion that is adapted well to the thermal coefficient of expansion of corundum, some of the advantages achieved would be lost again due to additional layers with different coefficients of expansion.

According to an embodiment of the invention, the membrane electrode comprises titanium oxide, which is non-stoichiometric, in particular $Ti_4O_7$, $Ti_5O_9$ or $Ti_6O_{11}$.

Non-stoichiometric titanium oxide has a higher conductivity than stoichiometric titanium oxide, and is particularly highly suitable as electrode material.

According to an embodiment of the invention, the membrane electrode comprises doped titanium oxide, which is doped with, in particular Cr, Nb or W.

According to an embodiment, the doping is up to about 10 atomic %, in particular not more than 8 atomic %, and preferably not more than 6 atomic %, related to the Ti atoms.

The doping of the titanium oxide leads to a further increase in conductivity of the electrode material.

According to an embodiment of the invention, the measuring membrane is joined to the base body by means of an active brazing solder, wherein the membrane electrode is in galvanic contact with the active brazing solder.

In this way, the membrane electrode also acts as a solder stop, which prevents entry of the active brazing solder into the pressure chamber when soldering the pressure-measuring cell. Due to the galvanic contact of the electrode with the active brazing solder, the membrane electrode can be contacted from the lateral surface of the pressure-measuring cell via the joint, wherein shielding of the electrode on the counter body side, in particular in the form of a Faraday cage, can be achieved by means of a conductive coating of the lateral surface of the counter body which contacts the joint, and if necessary, a conductive coating of a rear side of the counter body facing away from the measuring membrane.

According to an embodiment of the invention, the ceramic material of the measuring membrane and the counter body comprise an aluminum oxide ceramic, in particular a high-purity aluminum oxide ceramic, as described in, —for example the German patent DE 10 2008 036 381 B3. The grades of purity described therein relate, in particular to the ceramic of the measuring membrane, whereas such a high-purity ceramic is not mandatory for the counter body.

According to an embodiment of the invention, the active brazing solder comprises a zirconium-nickel-titanium-containing active brazing solder, as described, for example, in the European patent application EP 0 490 807 A2.

The method according to the invention for manufacturing a capacitive pressure-measuring cell comprises:

Providing a ceramic measuring membrane and a counter body;

Preparing at least one membrane-side electrode on the measuring membrane, and at least one electrode on the counter body side on a surface thereof;

Pressure-tight joining of the measuring membrane to the counter body, forming a pressure chamber between the measuring membrane and the counter body, wherein the membrane electrode comprises at least titanium oxide according to the invention.

According to an embodiment, at least the membrane electrode is prepared by first sputtering a metal layer, namely a titanium layer or a titanium layer that is doped with, for example, Cr, Nb, and/or W, which is then thermally oxidized.

In an embodiment of the invention, the oxidation is carried out by heating in an oxygen-containing atmosphere, for example in air, said oxidation takes place by heating to a temperature of not less than 500° C., in particular not less than 600° C.

In an embodiment of the invention, the membrane electrode is at least prepared by reactive sputtering of titanium oxide, which may especially be doped, in particular with Cr, Nb and/or W.

By preparation of the titanium oxide by reactive sputtering, subsequent oxidation is omitted.

According to an embodiment of the invention, joining of the measuring membrane with the counter body comprises the following steps:

Provision of the active brazing solder between the measuring membrane and a ceramic counter body in the surface areas of the measuring membrane and of the counter body to be wetted by the active brazing solder;

Heating of the measuring membrane, the counter body and the active brazing solder under vacuum up to a temperature at which the active brazing solder melts and reacts with the measuring membrane and the counter body; and Letting the pressure-measuring cell formed by joining cool down.

In an embodiment of the invention, the joining of the ceramic components with the active brazing solder takes place at a temperature of not less than 800° C., in particular not less than 840° C.

BRIEF DESCRIPTION OF THE DRAWINGS

The invention is now disclosed with reference to the exemplary embodiment illustrated in the drawings. Illustrated are.

DETAILED DISCUSSION IN CONJUNCTION WITH THE DRAWINGS

Figure 1:
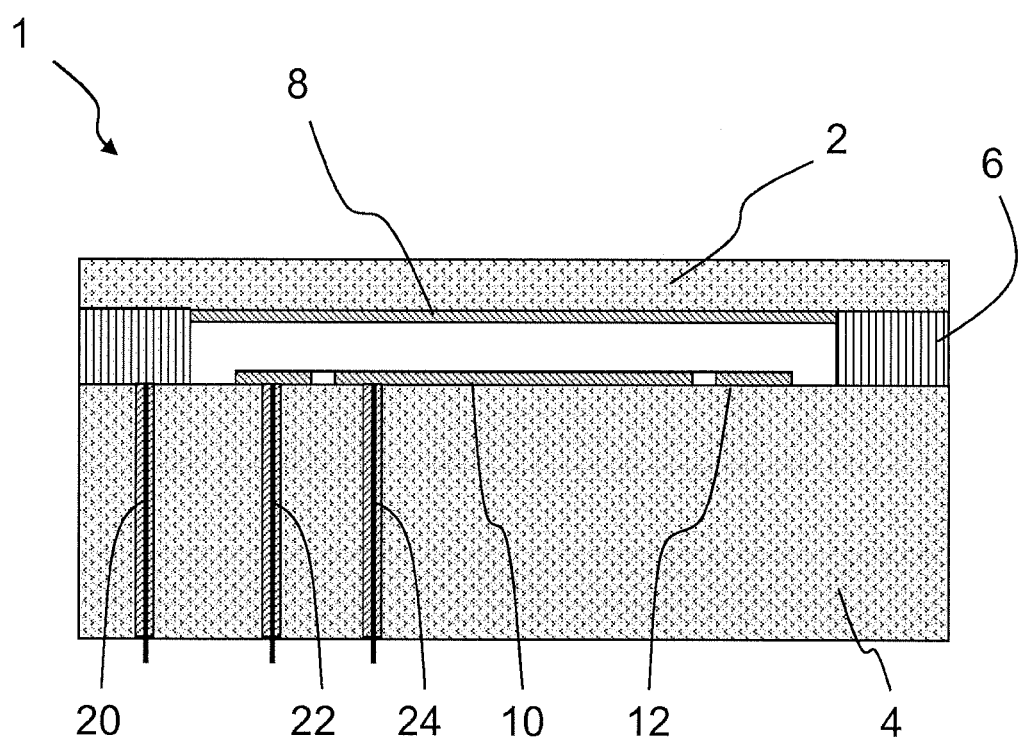
FIG. 1: which is a longitudinal section of a pressure-measuring cell according to the invention.

The pressure-measuring cell 1 shown in FIG. 1 comprises a measuring membrane 2, which has high-purity (>99.9%)

aluminum oxide, and a counter body 4, which also comprises aluminum oxide. The counter body 4 may have the same purity as the measuring membrane, wherein this is not absolutely necessary because the counter body is not in contact with the medium on the one hand, so that the requirements for corrosion resistance are lower and is not exposed to mechanical stresses like the measuring membrane 2 on the other hand. The measuring membrane is joined pressure-tight with the counter body along a circumferential joint 6, which has a Zr—Ni—Ti-containing active solder, thereby forming a pressure chamber between the measuring membrane 2 and the counter body 4.

For detecting a pressure-dependent deformation of the measuring membrane, the pressure-measuring cell 1 comprises a differential capacitor, which is formed by a membrane electrode 8 that is arranged on the measuring membrane 2, a central circular disk-shaped measuring electrode 10 on the counter body side and a reference electrode 12 surrounding the measuring electrode. Ideally, the capacitance value between the measuring electrode 10 and the membrane electrode 8 is equal to the capacitance between the reference electrode 12 and the membrane electrode 8, when the measuring membrane 2 is in the rest position. The membrane electrode 8 comprises titanium oxide that is prepared directly on the ceramic material of the measuring membrane 2.

The titanium oxide preferably includes a dopant with a few atomic % of Nb, whereby the conductivity of the electrode material is significantly improved.

The reference electrode 12 and the measuring electrode 10 may also comprise titanium oxide on the one hand, which is optionally doped, or, platinum or tantalum on the other. If tantalum electrodes are used, they must preferably be stabilized by thermal oxidation.

The membrane electrode 8 is electrically contacted via the joint 6, and an electrical feedthrough 20 that extends along the radial area of the joint 6 through the counter body. The measuring electrode 10 and the reference electrode 12 are contacted directly by the counter body 4 via electrical feedthroughs 22, 24. The electrical feedthroughs 20, 22, 24 comprise, for example tantalum pins, which are soldered pressure-tight in boreholes through the counter body 4 by means of an active brazing solder.

The membrane electrode 8 also acts as a solder stop, which prevents the active brazing solder from flowing radially inwardly out of the edge area into the pressure chamber during soldering of the counter body 4 and the measuring membrane 2.

Referring to FIGS. 2a-2d, the manufacturing steps for producing the pressure-measuring cell according to the invention are now briefly described.

Figure 2A:
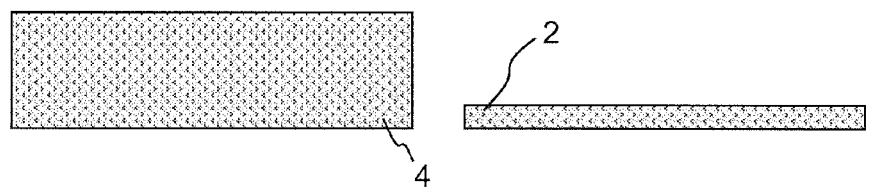
FIGS. 2a-2d: which show a sequence of preparatory steps for manufacturing a pressure-measuring cell according to the invention.

As shown in FIG. 2a, a circular disk-shaped measuring membrane 2 made of high-purity corundum and a stiffer, circular disk-shaped counter body 4 made of corundum are first provided.

Figure 2B:
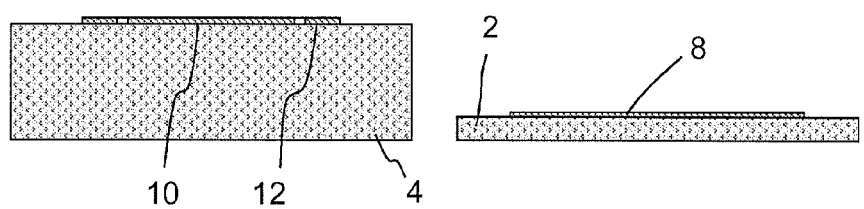

Then, as shown in FIG. 2b, the surfaces of the membrane electrode 8, the measuring electrode 10 and the reference electrode 12 are prepared on the counter body 4 and the measuring membrane 2.

The membrane electrode 8 and any other electrodes on the basis of titanium oxide comprise highly oxidized titanium, for example, $TiO_2$ and/or $Ti_4O_7$, which is prepared by sputtering of titanium and optionally doping metals (Cr, Nb, W) onto the ceramic material of the measuring membrane 2 or the counter body 4, followed by thermal oxidation at 600° C. in air.

In an alternative preparation, instead of the metallic titanium, titanium oxide can be deposited directly by reactive sputtering, wherein the subsequent oxidation step can be omitted.

Figure 2C:
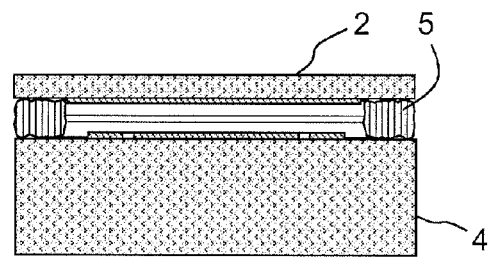

To prepare the joining of the measuring membrane 2 with the counter body 4, the two elements to be joined are coaxially stacked with an annular solder preform 5 in between, as shown in FIG. 2c. The annular solder preform 5 has a height of, for example, about 30 to 50 microns.

Finally, the components are soldered in a high-vacuum solder process at temperatures, for example 950° C., wherein the molten active brazing solder reacts with the ceramic surfaces of the measuring membrane 2 and the counter body 4, but it cannot flow over the edge of the membrane electrode 8 into the pressure chamber, since the oxygen from the titanium oxide at least partly enters the solder, and thus slags the solder so that it solidifies or becomes highly viscous and does not flow further into the pressure chamber. Nevertheless, a galvanic contact is established between the joint 6 and the membrane electrode 8, so that a metallic coating on an outer surface of the pressure-measuring cell can be brought into contact with the membrane electrode 8 via the joint.

Figure 2D:
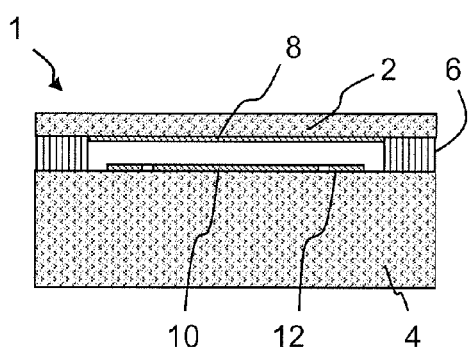

This results in the pressure-measuring cell shown in FIG. 2d.

Of course, this also includes the electrical feedthroughs described in connection with FIG. 1, which have however been omitted in FIGS. 2a to 2d for reasons of clarity. The feedthroughs are also soldered into the high-vacuum solder process.

In particular, drawing to scale has been omitted for the height ratios in the drawings to allow illustration of the layers, in particular. The pressure-measuring cell has a radius of about 10 mm. The height or axial thickness of the counter body is, for example, 3 to 15 mm. The thickness of the measuring membrane is, for example, not less than 100 microns, and no more than 2,000 microns. The layer thickness of the electrodes is about 100 nm. These dimensions are merely illustrative and are not to be considered for the definition or strict interpretation of the invention.

The invention claimed is:

1. A pressure-measuring cell, comprising:
    a ceramic measuring membrane;
    a ceramic counter body; and
    a capacitive transducer, wherein:
    said measuring membrane is joined in a pressure-tight manner with said counter body to form a pressure chamber between said measuring membrane and said counter body;
    said capacitive transducer detects a pressure-dependent deformation of said measuring membrane, and comprises at least one membrane electrode that is arranged on said measuring membrane and at least one electrode on said counter body side; and
    said at least one membrane electrode comprises a titanium oxide, wherein:
    the titanium oxide is arranged directly on the ceramic material of said measuring membrane;
    said measuring membrane is joined to said base body by means of an active brazing solder, wherein said at least one membrane electrode is in galvanic contact with the active brazing solder;
    said measuring membrane and said counter body comprise an aluminum oxide ceramic; and
    the active brazing solder comprises a nickel-titanium-zirconium-containing active brazing solder.

2. The pressure-measuring cell according to claim 1, wherein:

said at least one membrane electrode comprises titanium oxide, which is non-stoichiometric, in particular non-stoichiometric forms of $TiO_2$, $Ti_4O_7$, $Ti_5O_9$ or $Ti_6O_{11}$.

3. The pressure-measuring cell according to claim 1, wherein:

said at least one membrane electrode comprises doped titanium oxide, which is doped in particular with Cr, Nb or W.

4. The pressure-measuring cell according to claim 3, wherein:

the doping is up to about 10 atomic %, related to the Ti atoms.

5. The pressure-measuring cell according to claim 3, wherein:

the doping is not more than 6 atomic %, related to the Ti atoms.

6. A method of manufacturing a capacitive pressure-measuring cell, comprising a ceramic measuring membrane; a ceramic counter body; and a capacitive transducer, wherein: said measuring membrane is joined in a pressure-tight manner with said counter body to form a pressure chamber between said membrane and said counter body; said capacitive transducer detects a pressure-dependent deformation of said measuring membrane, and comprises at least one membrane electrode that is arranged on said measuring membrane and at least one electrode on said counter body side, and said at least one membrane electrode comprises a titanium oxide, the method comprises the following steps:

providing the measuring membrane and the counter body;

preparing at least one membrane-side electrode on the measuring membrane, and at least one electrode on the counter body side on a surface thereof; and pressure-tight joining of the measuring membrane to the counter body, forming a pressure chamber between the measuring membrane and the counter body, wherein:

at least the membrane electrode comprises titanium oxide;

the titanium oxide is prepared directly on the ceramic material of the measuring membrane: and the joining of the measuring membrane with the counter body comprises the following steps: provision of the active brazing solder between the measuring membrane and the counter body in the surface areas of the measuring membrane and of the counter body to be wetted by the active brazing solder; heating of the measuring membrane, the counter body and the active brazing solder under vacuum up to a temperature at which the active brazing solder melts and reacts with the measuring membrane and the counter body: and letting the pressure-measuring cell formed by joining cool down.

7. The method according to claim 6, wherein:

the membrane electrode is prepared by first sputtering a metal layer, namely a titanium layer or a titanium layer that is doped with, for example, Cr, Nb, and/or W, which is then thermally oxidized.

8. The method according to claim 7, wherein:

said oxidation is carried out by heating in an oxygen-containing atmosphere, for example in air, said oxidation takes place by heating to a temperature of not less than 500° C.

9. The method according to claim 7, wherein:

said oxidation is carried out by heating in an oxygen-containing atmosphere, for example in air, said oxidation takes place by heating to a temperature of not less than 600° C.

10. The method according to claim 6, wherein:

the membrane electrode is prepared by reactive sputtering of titanium oxide, which may especially be doped, in particular with Cr, Nb and/or W.

11. The method according to claim 6, wherein:

the joining of the ceramic measuring membrane and the ceramic counter body with the active brazing solder takes place at a temperature of not less than 800° C.

* * * * *